(12) United States Patent
Rubit et al.

(10) Patent No.: US 8,784,540 B2
(45) Date of Patent: Jul. 22, 2014

(54) SYSTEMS AND METHODS OF DUST MITIGATION

(75) Inventors: Arnold L. Rubit, Houston, TX (US); David A. Moore, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 84 days.

(21) Appl. No.: 13/263,807

(22) PCT Filed: Jun. 11, 2009

(86) PCT No.: PCT/US2009/047067
§ 371 (c)(1),
(2), (4) Date: Oct. 10, 2011

(87) PCT Pub. No.: WO2010/144088
PCT Pub. Date: Dec. 16, 2010

(65) Prior Publication Data
US 2012/0031272 A1 Feb. 9, 2012

(51) Int. Cl.
*B01D 46/00* (2006.01)
(52) U.S. Cl.
USPC .................. 95/287; 95/214; 95/273; 95/262; 95/267; 95/268; 55/467.1; 55/482; 55/482.1
(58) Field of Classification Search
USPC .................. 95/287, 214, 273, 262, 267–268; 55/467.1, 482, 482.1; 96/190, 215
See application file for complete search history.

(56) References Cited

U.S. PATENT DOCUMENTS

| 5,626,651 | A  | * | 5/1997  | Dullien ........................... 95/214 |
| 7,537,517 | B1 | * | 5/2009  | Meserth et al. ............... 454/184 |
| 2004/0003722 | A1 | * | 1/2004  | Odajima ........................... 96/66 |
| 2007/0089862 | A1 | * | 4/2007  | Lu et al. ................... 165/104.26 |
| 2010/0293905 | A1 | * | 11/2010 | Lin et al. ......................... 55/325 |

FOREIGN PATENT DOCUMENTS

JP 2000/151167 A 5/2000

OTHER PUBLICATIONS

PCT Written Opinion of the International Searching Authority, International Search Report, mailing date Jan. 25, 2010, English.

* cited by examiner

*Primary Examiner* — Jason M Greene
*Assistant Examiner* — Karla Hawkins

(57) ABSTRACT

There is provided an exemplary dust trap and a system and method for filtering air. An exemplary dust trap comprises a housing with an air intake. The exemplary dust trap also comprises a plurality of screens disposed within the housing downstream of the air intake and configured to pass air and capture airborne contaminants, wherein the screens are configured to provide an unscreened air passage between the screens.

13 Claims, 6 Drawing Sheets

SYSTEMS AND METHODS OF DUST MITIGATION

CROSS-REFERENCE TO RELATED APPLICATION

Pursuant to 35 U.S.C. §371, this application is the United States National Stage Application of International Patent Application No. PCT/US2009/047067, filed on Jun, 11, 2009, the contents of which are incorporated by reference as if set forth in their entirety herein.

BACKGROUND

Many of today's high-speed, high-power electronics generate significant amounts of heat. For example, data centers generally have large numbers of heat-generating electronic components, such as interconnected servers, switches, drive arrays, and other equipment. Laptop and desktop computers also generate significant amounts of heat. To prevent overheating, computer systems often include cooling systems, which may include fans, heatsinks, heatpipes, or the like.

Airborne dust can reduce cooling efficiency in computer systems by fouling cooling equipment and airflow paths. For example, dust may become trapped between the fins of a heatsink, reducing the flow of cooling air through the heatsink and increasing the likelihood that the electronic components may overheat. To mitigate computing failures because of dust fouling, dust filters can be employed to remove dust from the supply of cooling air. Generally, removing dust from flowing air has been performed by inserting a particle filter at an air intake. As air passes through the filter, dust particles and other contaminants are trapped within the filter material. However, as the mesh becomes substantially blocked by the dust particles, airflow through the filter drops substantially. Thus, the inlet filter method may often need frequent maintenance by the user to maintain sufficient system airflow for adequate cooling. If the inlet filters are not sufficiently maintained, the reduced airflow can result in a thermal event, such as overheating of electrical components or system shutdown.

However, if an inlet filter is not used, contaminants such as fibrous dust can have an adverse effect on high-density heatsinks. Fibrous dust is common in many user environments. Sources include textiles, building materials, cardboard, paper, housekeeping, plants, animals, and many others. As continuing miniaturization of electronics results in higher power density, heat sink fins are becoming thinner and more densely packed. The fins may often be close enough that they may be bridged by airborne fibers. The bridging fibers may then form a matrix that traps finer airborne particulates. This process can accelerate exponentially until the cooling area of the heat sink is substantially blocked.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Exemplary embodiments of the present invention relate to systems and methods for removing dust from a cooling system. Moreover, exemplary embodiments of the present invention provide a dust trap with longer-lasting dust removal effectiveness. Specifically, the dust trap can include a plurality of mesh baffles or screens configured to trap contaminants (such as dust fibers and particles) while also providing an unblocked path between the mesh baffles. The unblocked path enables air to flow through the dust trap even after the mesh baffles have been covered by contaminants. Furthermore, the unblocked path between the mesh baffles may include a winding air passageway that enables the dust trap to continue to trap contaminants even after the mesh baffles have become substantially blocked. Thus, the dust trap may prevent dust fibers from collecting inside electronic equipment, for example, on a heatsink, while still enabling significant airflow even after contaminants have covered the mesh baffles. Furthermore, the dust trap may be more effective at trapping larger, fibrous dust particles that are a more significant cause of heatsink clogging compared to smaller dust particles.

Figure 1:
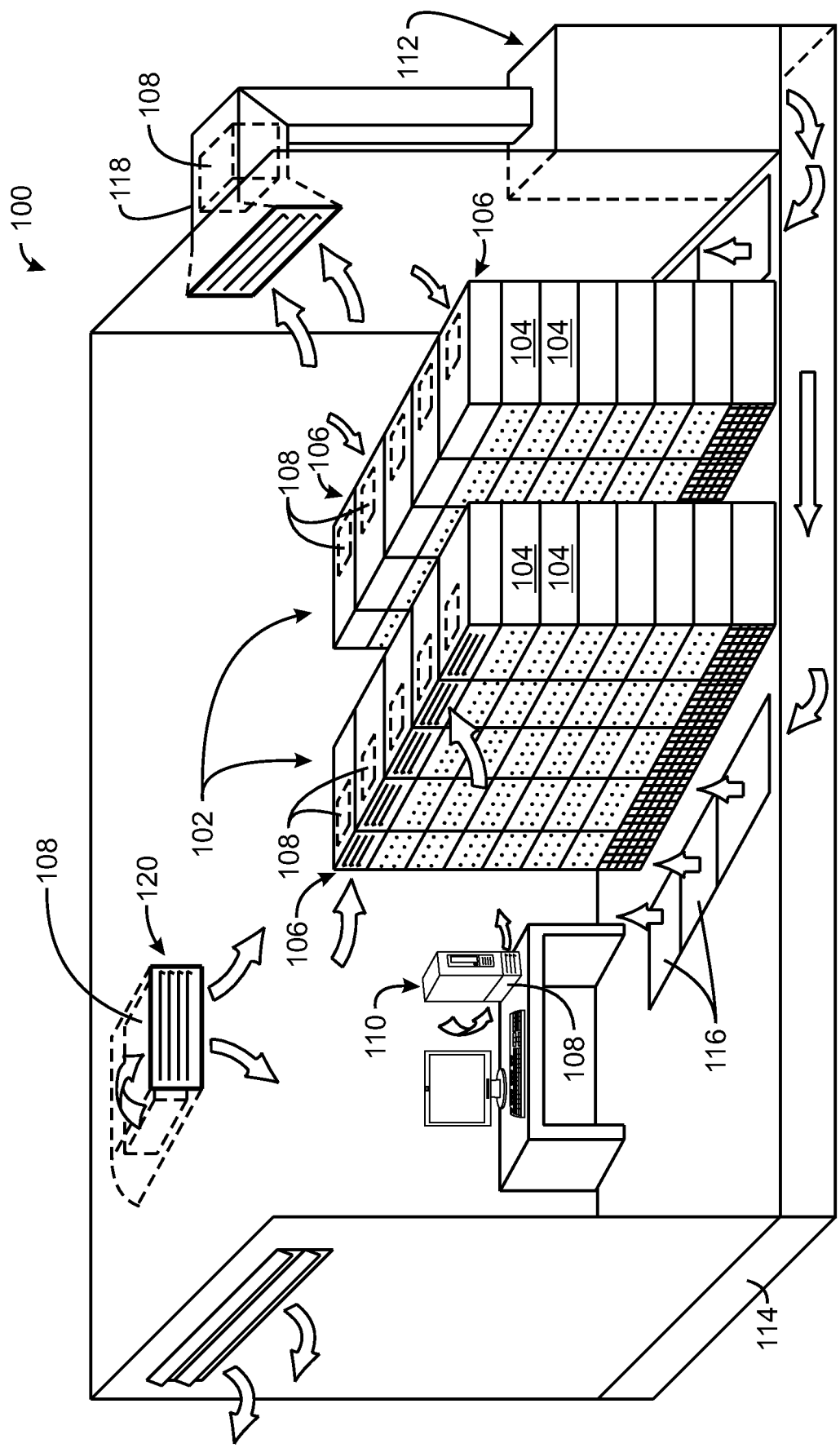
FIG. 1 is a partial cutaway perspective view of a computing facility that is useful in showing various potential locations for an improved dust trap in accordance with exemplary embodiments of the present invention.

FIG. 1 is a partial cutaway perspective view of a computing facility that is useful in showing various potential locations for an improved dust trap in accordance with exemplary embodiments of the present invention. In the exemplary embodiment shown in FIG. 1, the facility 100 may include a plurality of racks 102 that hold various electronic components 104, for example, to provide functionality for a data center. The electronic components 104 may include, for example, servers, switches, routers, drives, drive arrays, power supplies, or any combinations thereof. Each rack 102 may include an air intake 106 that provides cooling air to the electronic components 104 installed in the rack 102. Cool air may enter through the "front" of the rack 102 and exit through the "back" of the rack 102. Further, the racks 102 may be arranged so that the intakes 106 of two rows face the same aisle, which may be referred to as a "cold aisle." Likewise, the exhaust side of two rows of racks 102 may face each other, forming a "hot aisle." In this way, cold air can be supplied to the cold aisle without mixing with heated air from another row of racks 102. The intake vent 106 of each rack 102 may include a dust trap 108 that reduces the amount of contaminants entering the rack 102. In another exemplary embodiment, the facility 100 may have desktop computers 110 with dust traps 108 disposed at an air intake of the desktop computer 110.

In another exemplary embodiment, the facility 100 may have an air supply unit such as Computer Room Air Conditioner (CRAC) 112 that provides chilled air to the facility 100 through a raised floor plenum 114. Chilled air from the CRAC 112 may be delivered into the facility 100 from the raised floor plenum 114 through perforated tiles 116 disposed in the cold aisles. The exhaust air may be recaptured by an intake vent 118 of the heating/cooling unit 112. The intake vent 118 of the heating/cooling unit 112 may include a dust trap 108 to remove contaminants from the air supply delivered into the facility 100. Furthermore, the ducts 120 feeding air into the facility 100 may also include dust traps 108.

The various components described above are only examples of devices and systems that may include a dust trap 108 in accordance with exemplary embodiments of the present invention. Other examples include laptop computers, electronic test equipment such as network analyzers, laboratory equipment or the like. Furthermore, the dust trap 108 may also be used in a wide variety of settings, such as a factory floor, a laboratory, a mine.

Figure 2:
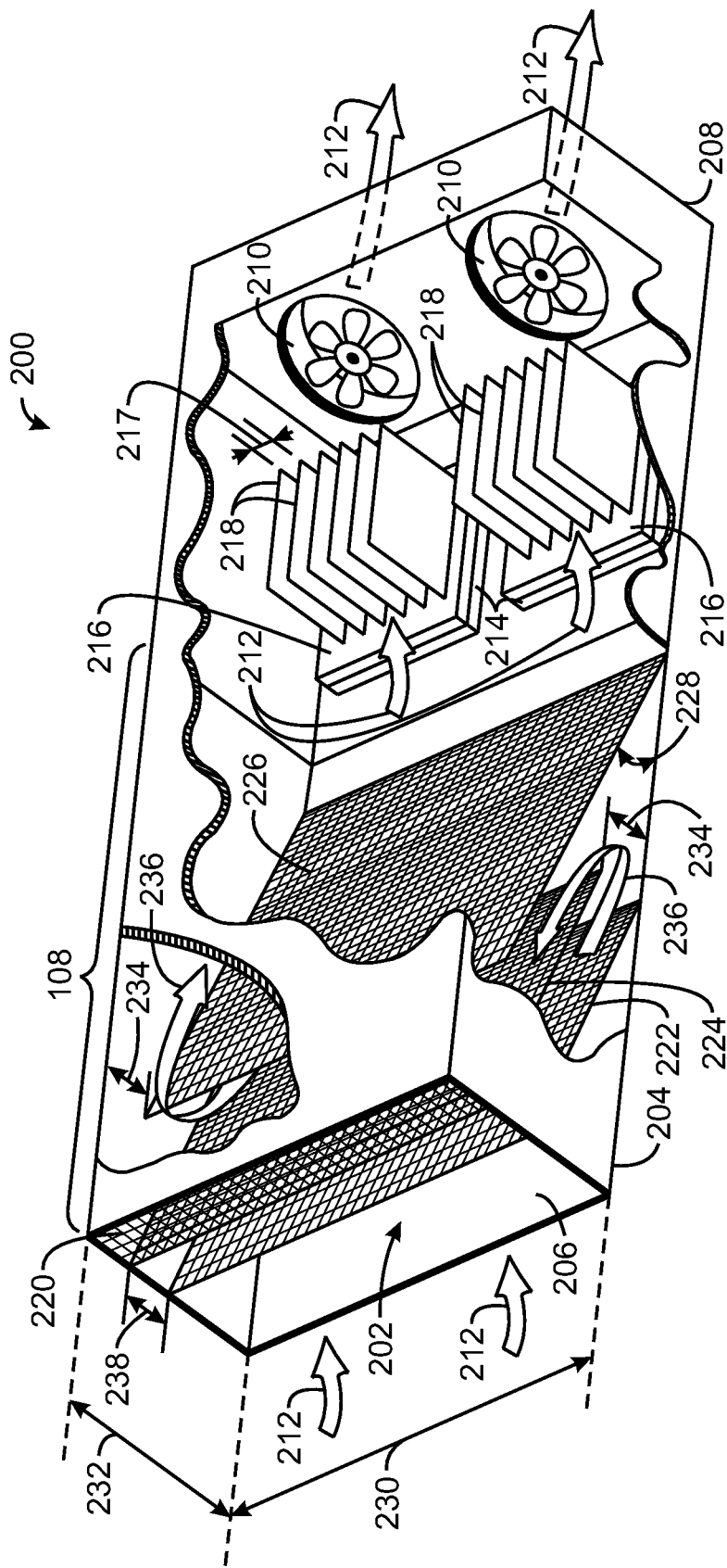
FIG. 2 is a partial cutaway perspective view of a computer system showing a cooling system with a dust trap, in accordance with an exemplary embodiment of the present invention.

FIG. 2 is a partial cutaway perspective view of a computer system showing a cooling system with a dust trap, in accordance with an exemplary embodiment of the present invention. Moreover, FIG. 2 shows a cooling system 200 with a dust trap 108.

As shown in FIG. 2, the cooling system 200 may include an enclosure 204 with an air channel 202 that extends from an air inlet 206 to an air exhaust 208. The cooling system 200 may include one or more fans 210 that draw cooling air through the air channel 202, as indicated by the arrows 212. The cooling air drawn through the channel 202 by the fans 210 may pass over and cool various electronic devices 214. The electronic devices 214 may be any suitable heat-generating electronic devices, such as processors, transistors, batteries, resistors, capacitors or the like. In some exemplary embodiments, the air channel 202 may include one or more heatsinks 216 disposed about the electronic devices 214. The heatsinks 216 may, for example, include heat dissipating fins 218.

In an exemplary embodiment of the present invention, a dust trap 108 can be included in the air channel 202. The dust trap 108 may be disposed at a location downstream from the air inlet 206 and upstream from the heatsinks 216. Cooling air is drawn into the air channel 202, through the dust trap 108 and then between the fins 218 of the heatsinks 216 to remove heat from the electronic device 214. In the illustrated exemplary embodiment, the heatsinks 216 and the dust trap 108 are shown in an in-line configuration relative to each other. However, the cooling system 200 may include any number of other configurations, in which the dust trap 108 may or may not be directly in-line with the air channel 202. For example, the air channel 202 can include various branches for cooling electronics 214 disposed in several compartments of a rack 102.

In addition, the dust trap 108 can be included in a removable cartridge that is inserted into the air channel 202. In this way, the dust trap 108 may be removed from the cooling system 200 and replaced if it becomes fouled.

As shown in FIG. 2, the dust trap 108 may include several mesh baffles 220-226 configured to trap contaminants entering the cooling system 200 through the air intake 206. The mesh baffles 220-226 may include any suitable, air-permeable material capable of capturing contaminants, including a woven cloth, metallic, or polymer mesh or screen. In an exemplary embodiment of the present invention, the mesh baffles 220-226 may comprise an eighty-mesh woven copper.

As shown in FIG. 2, exemplary embodiments of the dust trap 108 may include four baffles 220-226. However, other exemplary embodiments may have from two baffles up to any suitable number of baffles depending on system design considerations.

As will be discussed further below, it has been discovered that relatively small dust particles do not tend to collect on the fins 218 of the heatsink 216 and, thus, do not significantly degrade heatsink 216 performance. Therefore, in various exemplary embodiments of the present invention, the baffles 220-226 may be configured to trap larger, fibrous dust particles while allowing smaller dust particles to pass through. Specifically, a mesh size may be selected on the basis of a separation distance 217 between the fins 218 of the heatsinks 216, as explained with reference to FIG. 3. In this way, contaminants small enough to pass through the fins 218 of the heatsink 216 without becoming trapped between the fins 218 may also pass through the mesh baffles 220-226.

In an exemplary embodiment of the present invention, the mesh baffles 220-226 may be positioned inside the air channel 202 such that dust is captured from the air as it passes through the one or more baffles 220-226. In addition, the baffles 220-226 are also configured to provide an unscreened air passage through the air channel 202, as indicated by the arrows 236. The unscreened air passage allows for continued airflow and dust trapping even after the baffles 220-226 are covered and blocked with dust.

Each of the plurality of mesh baffles 220-226 spans less than the full cross-sectional area of the air channel. For example, each mesh baffle 220-226 may span the full width 230 of the air channel 202, but only span a portion of the height 232 of the air channel 202. In one exemplary embodiment, a first baffle 220 may be positioned crosswise relative to the air channel 202 and span a top portion of the air intake 206. Three additional mesh baffles 222, 224, 226 may be disposed in parallel within the air channel 202, slanted toward the intake 206 at an angle 228 relative to the air channel 202. Each of the three additional baffles 222, 224, 226 also spans only a portion of the height 232 of the air channel 202. In this way, gaps 234 are formed between an inside wall of the enclosure 204 and the top or bottom edge of the baffles 222, 224 and 226. From one baffle to the next, the air gap 234 alternates between the top and bottom of the enclosure 204. Further, the parallel mesh baffles 222, 224, 226 are spaced apart by a distance 238 to enable air to travel between the baffles 222, 224, 226, and through the air gaps 234, as indicated by the arrows 236. The mesh baffle configuration described above results in a convoluted or winding pathway through the series of baffles 222, 224, 226.

The desired level of airflow and the space available to accommodate the dust trap 108 may determine the angle 228 of the baffles 222, 224, 226 relative to the outer case of the dust trap 108, the distance 238 between the baffles, and the air gap 234. For example, the desired level of airflow may depend on the level of cooling desired for a cooling system or the amount of ventilation desired for a room. Generally, the airflow may be increased by increasing the angle 228 of the mesh baffles 220-226, increasing the space 238 between the baffles 220-226, or increasing the width of the gaps 234 between the mesh baffles and the inside wall of the enclosure 204. The amount of space available for the dust trap 108 may depend on the size of a specific computer system or other application. For example, a smaller dust trap 108 may be deployed in a desktop computer 110, while a larger dust trap 108 may be deployed in a heating/cooling unit 112 or an air duct 116. In exemplary embodiments, the angle 228 of the baffles 222, 224, 226 may be approximately twenty to fortyfive degrees, the space 238 between the baffles may be approximately 0.25 to 1.0 inches, and the air gap 234 between the baffles 222, 224, 226 and the inside wall of the enclosure 204 may be approximately 0.25 to 1.0 inch.

It will be appreciated that exemplary embodiments of the dust trap 108 are not limited to the configuration shown in FIG. 2. Various alterations and adjustments may be made while remaining within the scope of the present claims. For example, in another exemplary embodiment, the baffles 220-226 may be configured to span the full height 232 of the air channel 202, but only a portion of the width 230 of the channel 202. Accordingly, the gap 234 between the baffles 222, 224, 226 and the inside wall of the enclosure 202 may alternate from side to side rather than top to bottom. Other alternative embodiments are discussed in greater detail below.

Figure 3:
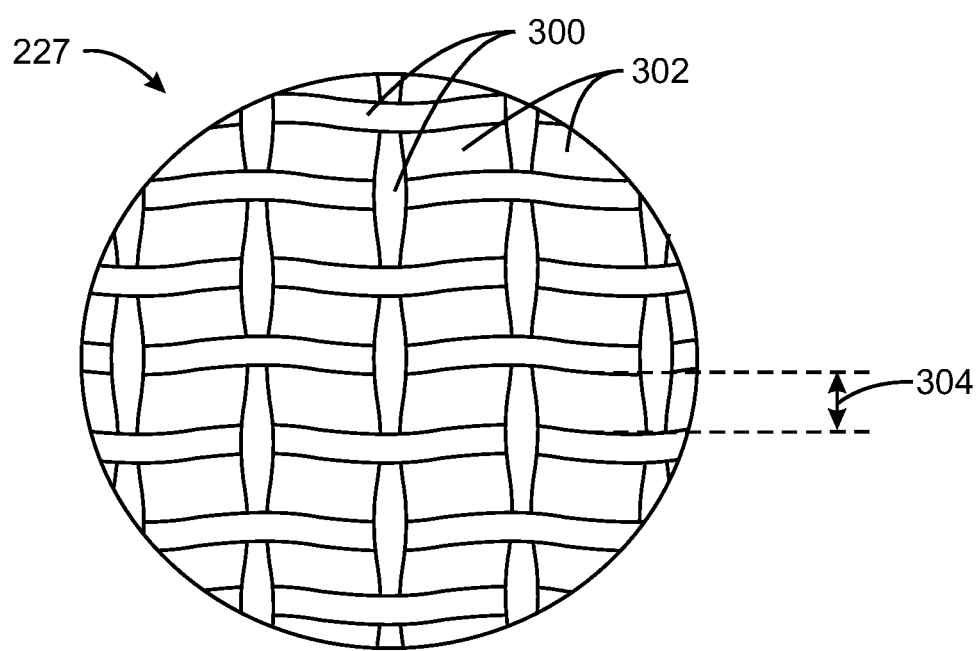
FIG. 3 is a diagram showing a close-up view of a portion of a mesh baffle disposed in a dust trap, in accordance with an exemplary embodiment of the present invention.

FIG. 3 is a diagram showing a close-up view of a portion 227 of a mesh baffle disposed in a dust trap, in accordance with an exemplary embodiment of the present invention. The portion 227 is representative of one of the mesh baffles 220-226 shown in FIG. 2. As shown in this illustration, the portion 227 of the mesh baffle includes a mesh 300 with openings 302. The width 304 of the openings 302 in the mesh 300 may generally be equal to or less than the separation distance 217 between the fins 218. In this way, larger contaminants that are capable of being trapped between the fins 218 are instead trapped by the mesh 304, while smaller particles that will normally pass between the fins 218 unhindered will similarly pass through the openings 302 in the mesh 304. Thus, smaller dust particles that have little or no impact on the heatsinks 216 are not significantly trapped by the baffles 220-226 and, therefore, do not contribute to the clogging of the baffles 220-226. This arrangement of the mesh baffles 220-226 results in a longer useful life of the dust trap 108 compared to conventional dust filters that trap particles too small to significantly degrade the performance of the heatsink 216.

In exemplary embodiments of the present invention, the width 304 of the openings 302 may be 50% to 90% of the separation distance 217 between the fins 218 of the heatsink 216. Moreover, the widths of the openings may be in the range of 50%, 60%, 70%, 80% or 90% of the separation distance 217 between the fins 218 of the heatsink 216.

Figure 4:
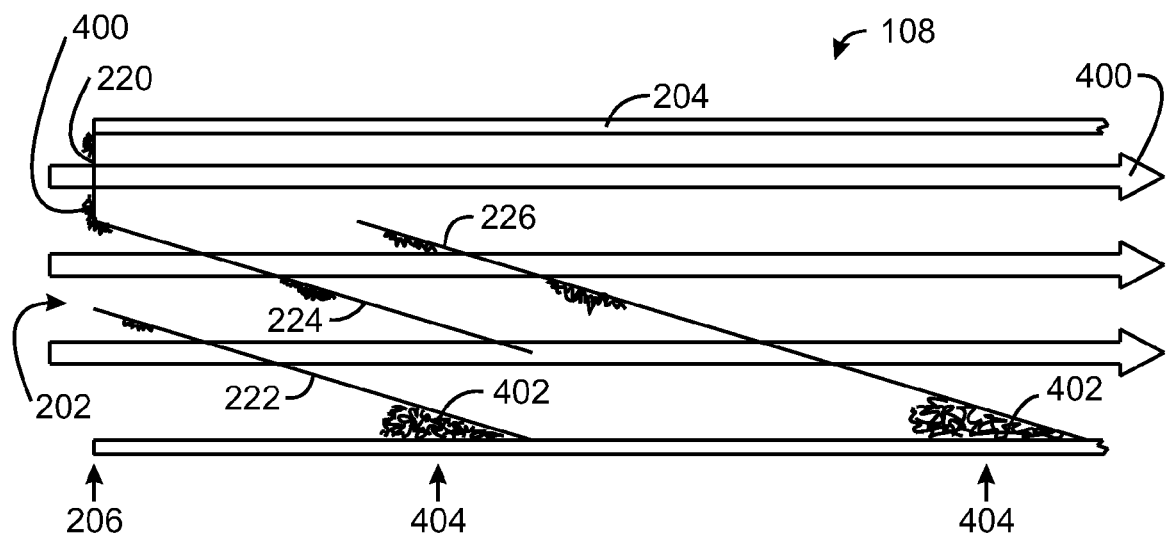
FIG. 4 is a diagram of a dust trap operating with substantially unblocked mesh baffles, in accordance with an exemplary embodiment of the present invention.

FIG. 4 is a diagram of an exemplary dust trap operating with substantially unblocked mesh baffles, in accordance with an exemplary embodiment of the present invention. In FIG. 4, the dust trap 108 is shown with a small amount of dust particle accumulation. Thus, air traveling through the dust trap 108 may generally flow in a substantially straight line through the baffles 220-226 of the dust trap 108, as indicated by the arrows 400. As the air travels through the baffles 220-226, dust particles 402 larger than the openings in the mesh may be trapped on the upstream side of the baffles 220-226. The dust particles 402 may have a tendency to be blown forward and downward, toward the corners 404 where the baffles 222 and 226 meet the bottom surface of the enclosure 204. In this way, the incoming air tends to force dust particles 402 to the bottom of the air channel 102, thus enabling large areas of the baffles 220-226 to remain relatively free of dust.

In one exemplary embodiment of the present invention, the baffles 220=226 are tilted in the air channel 202. The tilting of the baffles 220-226 within the air channel 202 increases the surface area available for trapping dust compared to a similar size channel 202 with crosswise, i.e. perpendicular, baffles. Thus, the tilting of the baffles 220-226 further increases the useful life of the dust trap 108. As the dust trap 108 continues to collect dust, the mesh baffles 220-226 gradually become increasingly blocked by the collected dust. As the mesh baffles 220-226 become blocked, airflow will tend to be redirected around and between the mesh baffles 220-226, as discussed with respect to FIG. 5.

Figure 5:
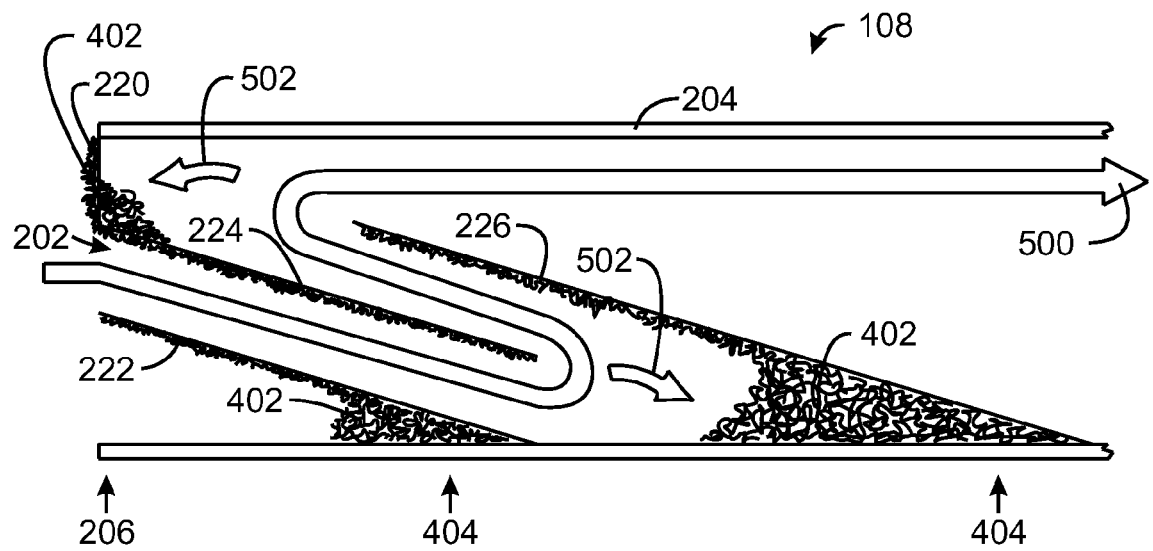
FIG. 5 is a diagram of the dust trap shown in FIG. 3 operating with substantially blocked mesh baffles, in accordance with an exemplary embodiment of the present invention.

FIG. 5 is a diagram of the dust trap shown in FIG. 3 operating with substantially blocked mesh baffles, in accordance with an exemplary embodiment of the present invention. As shown in FIG. 5, dust particles 402 have collected on substantially all of the surfaces of the baffles 220-226, thereby blocking the direct flow of air through the baffles 220-226. Despite the fact that the baffles 220-226 are substantially blocked, air continues to flow through the dust trap 108 which continues to trap dust. However, in this condition, most of the cooling air now travels through the dust trap 108 via the winding air passage between the baffles 222, 224, 226, as indicated by the arrow 500. The larger mass of the dust particles compared to the air molecules provides a greater momentum, which tends to oppose quick turns. Therefore, each time the cooling air changes direction inside the dust trap 108, the dust particles tend to separate from the air. Therefore, the dust particles tend to accumulate at the internal corners of the dust trap 108, as indicated by the arrows 502. In this way, the dust trap 108 may continue to trap contaminants even after the direct airflow through the baffles 220-226 is substantially blocked.

EXPERIMENTAL

To evaluate the benefits of a dust trap in accordance with an exemplary embodiment of the present invention, several experiments were performed with cooling systems in an environmental dust chamber capable of simulating various types of dust exposure. In the experiments, various cooling system configurations were exposed to a mix of airborne fiber and fine particulate dust to simulate actual operating conditions. A thermal resistance, $\theta_{ja}$, was measured using a resistive heater to simulate a processor junction. In each of the tests, a heatsink was disposed adjacent to the simulated junction, and the thermal resistance, $\theta_{ja}$, was measured under various dust loading conditions. The thermal resistance is defined herein according to the following equation:

$$\theta_{ja} = \Delta T/P (° C./Watt)$$

Where $\theta_{ja}$ is the thermal resistance from the resistive heater to the ambient air, $\Delta T$ is the temperature difference between the resistive heater and the ambient air, and P equals the power applied to the resistive heater.

Table 1 shows test results comparing the effectiveness of the heatsink in cooling systems with and without a dust trap in accordance with present embodiments. For the tests, the thermal resistance, $\theta_{ja}$, of a heatsink was measured for four different test configurations: mineral dust (i.e. small particle dust) with no dust mitigation; fibrous dust with no dust mitigation; fibrous dust with a dust filter; and fibrous dust with a dust trap in accordance with embodiments of the present invention. The line labeled "$\theta_{ja}$ Before" shows the heatsink thermal resistance, measured before exposure to dust. The line labeled "θja After" shows the heatsink thermal resistance after exposure to dust.

TABLE 1

Results of Heat Sink Effectiveness Tests.

| | Mineral Dust | Fibrous Dust | Fibrous Dust with Dust Filter | Fibrous Dust with Dust Trap |
|---|---|---|---|---|
| $\theta_{ja}$ Before | 0.28 | 0.24 | 0.26 | 0.27 |
| $\theta_{ja}$ After | 0.28 | 0.61 | 0.89 | 0.38 |
| $\theta_{ja}$ Increase | 0% | 150% | 242% | 41% |
| Dust Type | Mineral | Fiber | Fiber | Fiber |
| Dust Mitigation | None | None | Dust Filter | Dust Trap |

As shown in the Table 1, in the case of mineral dust exposure with no dust mitigation, $\theta_{ja}$ of the heatsink does not increase significantly after exposure. This can be attributed to the fact that the mineral dust, which is very fine, passes through the fins of the heatsink without being captured and, therefore, does not significantly reduce the amount of air passing between the fins. In the case of fibrous dust exposure with no dust mitigation, the dust increases the $\theta_{ja}$ of the heatsink by 150%. This can be attributed to clogging of the heatsink by the dust, which tends to both insulate the heatsink and reduce airflow through the heatsink. In the case of fibrous dust exposure with a dust filter, the $\theta_{ja}$ of the heatsink increases by 242% after exposure to dust. Thus, the $\theta_{ja}$ increase using a dust filter is greater than the $\theta_{ja}$ increase using no dust mitigation at all. This can be attributed to the fact that the filter becomes quickly clogged with dust, which reduces airflow through the filter and thus the heatsink as well. In the case of fibrous dust exposure and use of a dust trap in accordance with an exemplary embodiment of the present invention, the $\theta_{ja}$ of the heatsink increased only 41% after exposure to the dust. Therefore, it can be seen that the use of a dust trap, significantly improves performance of a heatsink exposed to large, fibrous dust particles.

As described above, exemplary embodiments of the present invention enable fine dust particles to pass through the dust trap while trapping large fibrous dust particles. In some exemplary embodiments, however, it may be advantageous to provide a flow of air that is also free of fine particles and/or chemical impurities.

Figure 6:
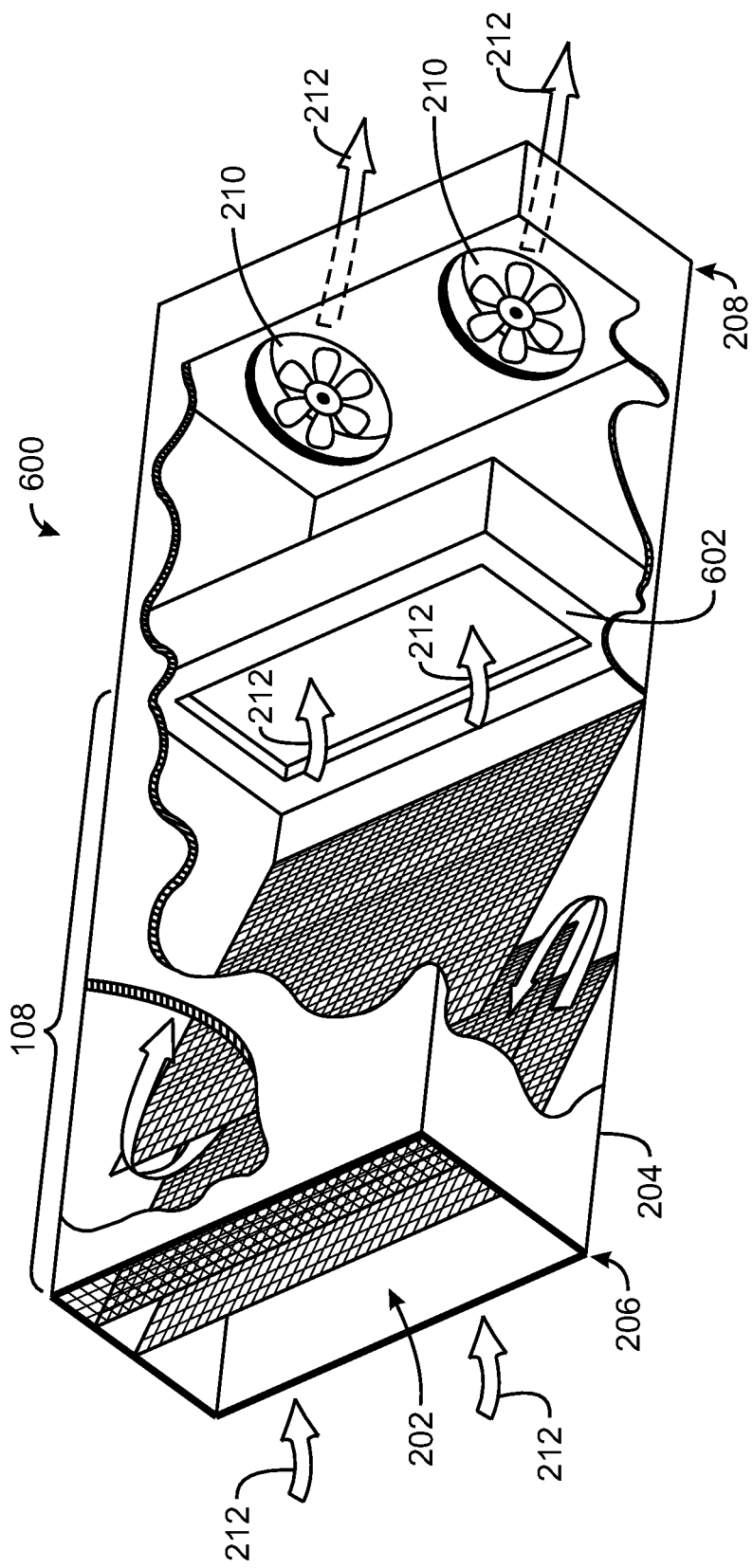
FIG. 6 is a partially cutaway perspective view of a computer system showing an air supply system with a dust trap, in accordance with an embodiment of the present invention.

FIG. 6 is a partially cutaway perspective view of a computer system showing an air supply system with a dust trap, in accordance with an embodiment of the present invention. As described with respect to FIG. 2, the air supply system 600 may include an enclosure 204 with an air channel 202 that extends from an air inlet 206 to an air exhaust 208. The air supply system 600 may include one or more fans 210 that draw a supply of air through the air channel 202, as indicated by the arrows 212. The air drawn through the channel 202 by the fans 210 may be used for any suitable purpose, such as cooling, ventilation, combustion, or chemical processing, for example. The air supply system 600 may also include an air filter 602. The air filter 602 may include any suitable air-permeable filtering material such as a cloth, metal, paper, or polymer, for example. In some exemplary embodiments, the air filter 602 may also include a chemical additive, such as activated carbon, to absorb or neutralize certain chemical impurities.

To lengthen the useful life of the air filter 602, the air supply unit 600 may also include a dust trap 108 disposed downstream from the air inlet 206 and upstream from the air filter 602. Air drawn into the air channel 202 flows first through the dust trap 108, which captures larger dust particles and fibers before the air is filtered by the air filter 602. Thus, much of the dust that would otherwise tend to clog the air filter 602 is instead captured by the dust trap 108. In this way, the air filter 602 stays relatively free of dust for a longer period, and the useful life of the air filter 602 may, therefore, be extended.

Figure 7:
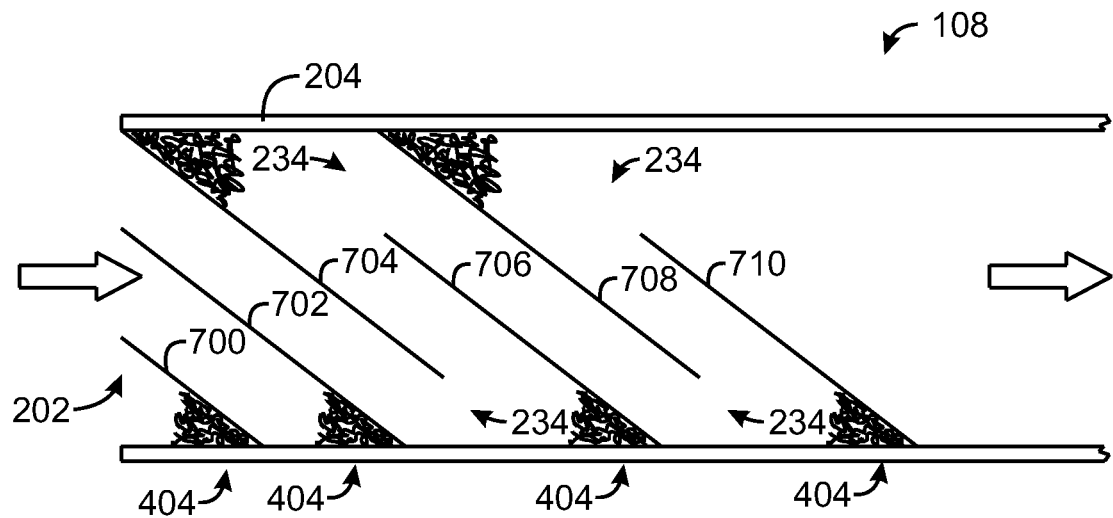
FIG. 7 is a diagram showing a dust trap with six angled mesh baffles, in accordance with an exemplary embodiment of the present invention.

FIG. 7 is a diagram showing a dust trap with six angled mesh baffles, in accordance with an exemplary embodiment of the present invention. As in FIG. 2, the dust trap of FIG. 7 also includes a plurality of mesh baffles 700-710 disposed in parallel within the air channel 202 and slanted toward the intake 206 at an angle 228 relative to the air channel 202. Likewise, the mesh baffles 700-710 are arranged such that alternating gaps 234 are formed between an inside wall of the enclosure 204 and the top or bottom edge of the baffles 700-710 to form a winding path through the series of baffles. However, in the exemplary embodiment illustrated in FIG. 7, the dust trap 108 includes six baffles 700-710 rather than the four baffles of the exemplary embodiment shown in FIG. 2.

The increased number of baffles results in greater surface area for trapping dust as well as more corners 404 into which the trapped dust may settle. Furthermore, if the baffles 700-710 become blocked with dust, the winding air channel between the baffles 700-710 will provide two additional airflow turns compared to the embodiments of FIG. 2. The additional airflow turns provide additional areas in which dust may be separated from the air. Together the greater dust trapping surface area and the greater number of turns inside the dust trap 108 may result in a longer lasting dust trap 108 that captures a greater percentage of the fibrous dust passing through the dust trap 108. Such a configuration may be particularly useful for slower air flows, in which the complex filter may not significantly increase the back pressure on the system.

Figure 8:
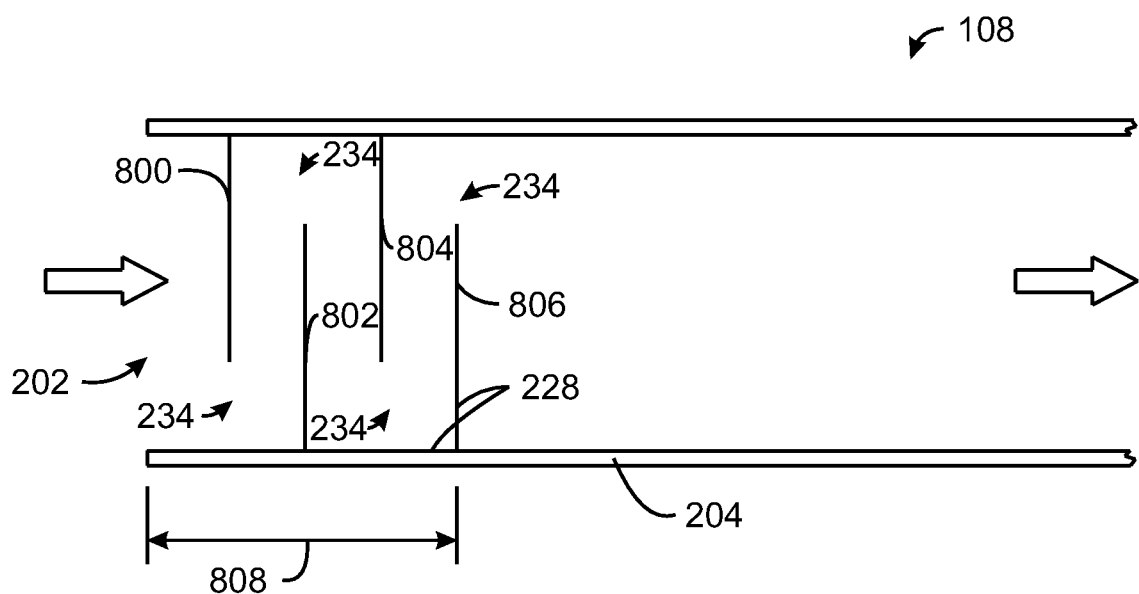
FIG. 8 is a diagram showing dust trap with four perpendicular mesh baffles, in accordance with an exemplary embodiment of the present invention.

FIG. 8 is a diagram showing dust trap with four perpendicular mesh baffles, in accordance with an exemplary embodiment of the present invention. As in FIGS. 2 and 7, the dust trap of FIG. 8 also includes a plurality of mesh baffles 800-806 disposed in parallel within the air channel 202. Likewise, the mesh baffles 800-806 are arranged such that alternating gaps 234 are formed between an inside wall of the enclosure 204 and the top or bottom edge of the baffles 800-806 to form a winding path through the series of baffles 800-806. However, in the exemplary embodiment shown in FIG. 8, the baffles 800-806 are crosswise or perpendicular relative to the axis of the enclosure 204, i.e., the angle 228 is approximately ninety degrees. The perpendicular angle of the baffles may result in lower back pressure and increased airflow through the dust trap 108, while still providing significant levels of dust trapping. Moreover, the length 808 of the dust trap 108 may be significantly reduced compared to the length of the dust traps 108 shown in FIGS. 2 and 7. Therefore, the dust trap 108 shown in FIG. 8 may be particularly useful in applications such as desktop or laptop computers, wherein the amount of space available for a dust trap 108 may be more limited.

What is claimed is:

1. A dust trap, comprising:
   a housing comprising an air intake; and
   a plurality of screens disposed within the housing downstream of the air intake and configured to pass air and capture airborne contaminants, wherein the screens are configured to provide an unscreened air passage between the screens, and wherein the unscreened air passage comprises a series of slanted gaps located between an internal surface of the housing and alternating edges of each of the screens.

2. The dust trap of claim 1, wherein a mesh size of the screens is configured to trap contaminants larger than a space between fins of a heatsink while allowing dust particles smaller the space between the fins to pass through.

3. The dust trap of claim 1, wherein the unscreened air passage provides separation of the contaminants from the air, based at least in part on a velocity of the air.

4. The dust trap of claim 1, wherein the air travels in a substantially straight path through the screens when the screens are not blocked; and wherein the air travels a convoluted air passage through the unscreened air passage when the screens are blocked.

5. A system for filtering air, comprising:
   a fan configured to provide a flow of cooling air through an air channel;
   a heatsink disposed in the air channel and configured to receive the flow of cooling air; and
   a dust trap comprising a plurality of mesh baffles disposed inside the air channel, wherein each of the plurality of mesh baffles spans less than the full cross-sectional area of the air channel and are configured to provide an unscreened air passage, and wherein the plurality of mesh baffles are slanted to form the unscreened air passage toward an air intake of the air channel.

6. The system of claim 5, wherein the plurality of mesh baffles comprises a first mesh baffle forming a first gap between an edge of the first mesh baffle and a first internal wall of the air channel; and at least a second mesh baffle forming a second gap between an edge of the second mesh baffle and second internal wall of the air channel.

7. The system of claim 5, wherein the plurality of mesh baffles form a convoluted air passage configured to trap dust, based at least in part on a velocity of the air.

8. The system of claim 5, wherein the heatsink comprises a finned heatsink, and the dust trap is configured to trap dust particles larger than the space between the fins while allowing dust particles smaller the space between the fins to pass through.

9. A method for filtering air, comprising:
   receiving a flow of air;
   passing the air through a plurality of baffles if the plurality' of baffles is substantially unblocked by contaminants; and
   passing the air through a winding path between the plurality of baffles if the plurality of baffles is substantially blocked by the contaminants, and wherein the winding path comprises a series of slanted gaps located between an internal surface of a housing and alternating edges of each of the baffles.

10. The method of claim 9, comprising passing the air through fins of a heatsink after passing the air by the plurality of baffles.

11. The method of claim 10, wherein capturing contaminants carried in the flow of air comprises capturing particles large enough to be trapped on the fins of the heatsink.

12. The method of claim 9, comprising passing the air through a filter after passing the air bythe plurality of baffles.

13. The method of claim 9, comprising guiding the air about a corner formed by one or more of the plurality of baffles and collecting heavier contaminants in the corner.

* * * * *

UNITED STATES PATENT AND TRADEMARK OFFICE
CERTIFICATE OF CORRECTION

| | | |
|---|---|---|
| PATENT NO. | : 8,784,540 B2 | |
| APPLICATION NO. | : 13/263807 | |
| DATED | : July 22, 2014 | |
| INVENTOR(S) | : Arnold L. Rubit et al. | |

It is certified that error appears in the above-identified patent and that said Letters Patent is hereby corrected as shown below:

IN THE CLAIMS

In column 10, line 8, in Claim 9, delete "plurality'" and insert -- plurality --, therefor.

In column 10, line 25, in Claim 12, delete "bythe" and insert -- by the --, therefor.

Signed and Sealed this
Tenth Day of March, 2015

Michelle K. Lee
*Deputy Director of the United States Patent and Trademark Office*